(12) United States Patent
Lee et al.

(10) Patent No.: US 10,971,207 B2
(45) Date of Patent: *Apr. 6, 2021

(54) SEMICONDUCTOR MEMORY DEVICE

(71) Applicant: SK hynix Inc., Gyeonggi-do (KR)

(72) Inventors: Jae-Seung Lee, Gyeonggi-do (KR); No-Geun Joo, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/751,427

(22) Filed: Jan. 24, 2020

(65) Prior Publication Data

US 2020/0160904 A1    May 21, 2020

Related U.S. Application Data

(62) Division of application No. 15/832,063, filed on Dec. 5, 2017, now Pat. No. 10,573,369.

(30) Foreign Application Priority Data

Apr. 11, 2017    (KR) ........................ 10-2017-0046754

(51) Int. Cl.
*G11C 11/406*    (2006.01)
*G11C 11/408*    (2006.01)

(52) U.S. Cl.
CPC ....... *G11C 11/40611* (2013.01); *G11C 11/408* (2013.01); *G11C 11/40603* (2013.01)

(58) Field of Classification Search
CPC ............. G11C 11/40611; G11C 11/408; G11C 11/40603

USPC .......................................................... 365/149
See application file for complete search history.

(56) References Cited

U.S. PATENT DOCUMENTS

| | | | |
|---|---|---|---|
| 2013/0282973 A1* | 10/2013 | Kim ...................... | G11C 11/408 711/106 |
| 2015/0049566 A1* | 2/2015 | Lee ........................ | G11C 11/408 365/222 |
| 2015/0049567 A1* | 2/2015 | Chi .................... | G11C 11/40622 365/222 |
| 2015/0055420 A1* | 2/2015 | Bell ...................... | G11C 7/1012 365/189.02 |
| 2015/0085563 A1* | 3/2015 | Yoon ..................... | G11C 11/406 365/149 |
| 2015/0085564 A1* | 3/2015 | Yoon .................. | G11C 11/40611 365/149 |
| 2015/0162071 A1* | 6/2015 | Yoon ..................... | G11C 11/406 365/203 |
| 2015/0206572 A1* | 7/2015 | Lim ....................... | G11C 11/406 365/203 |

(Continued)

*Primary Examiner* — Sung Il Cho
(74) *Attorney, Agent, or Firm* — IP & T Group LLP

(57) ABSTRACT

A semiconductor memory device includes a first count circuit suitable for counting a first clock signal which continuously toggles in each burst refresh cycle, and generating a first count code signal, based on a burst refresh command signal; a cycle guide circuit suitable for generating a second clock signal which toggles once in each burst refresh cycle, based on the burst refresh command signal and a precharge signal; a second count circuit suitable for counting the second clock signal and generating a second count code signal; and a control circuit suitable for generating a latch control signal for latching a target address in each burst refresh cycle, based on the first count code signal and the second count code signal.

11 Claims, 13 Drawing Sheets

(56) References Cited

U.S. PATENT DOCUMENTS

| | | | |
|---|---|---|---|
| 2016/0019944 A1* | 1/2016 | Jung | G11C 11/40611 365/200 |
| 2016/0086650 A1* | 3/2016 | Kim | G11C 11/406 365/222 |
| 2016/0111140 A1* | 4/2016 | Joo | G11C 11/40615 365/222 |
| 2016/0293243 A1* | 10/2016 | Joo | G11C 11/40618 |

* cited by examiner

SEMICONDUCTOR MEMORY DEVICE

CROSS-REFERENCE TO RELATED APPLICATION

This application is a division of U.S. patent application Ser. No. 15/832,063 filed on Dec. 5, 2017, which claims priority of Korean Patent Application No. 10-2017-0046754, filed on Apr. 11, 2017. The disclosure of each of the foregoing applications is incorporated herein by reference in its entirety.

TECHNICAL FIELD

Exemplary embodiments relate to a semiconductor design technology, and more particularly, to a semiconductor memory device performing a refresh operation.

DISCUSSION OF THE RELATED ART

A memory cell of a semiconductor memory device is configured by a transistor serving as a switch and a capacitor storing charges (data). Data is divided into a logic high level (logic 1) or a logic low (logic 0) level depending on whether or not charges are present in the capacitor of the memory cell, that is, whether a voltage across the capacitor is high or low. In principle, the storage of data does not consume power because it is implemented in such a manner that charges are accumulated in the capacitor. However, data may be lost because an initial amount of charges stored in the capacitor may decrease due to leakage current attributable to the PN junction of a MOS transistor, or the like. In order to prevent this, data in the memory cell should be read before the data is lost, and a normal amount of charges should be recharged based on a read-out information. Memory of data may be retained only when such an operation is periodically repeated. Such a process of recharging cell charges is called a refresh operation.

Meanwhile, as the degree of integration of a semiconductor memory device increases, a spacing between the plurality of word lines included in the semiconductor memory device is reduced. As the spacing between the word lines is reduced, a coupling effect between adjacent word lines increases.

Each time data is inputted to and outputted from a memory cell, a word line toggles between an activated (active) state and a deactivated (inactive) state. In this regard, as a coupling effect between adjacent word lines increases as described above, a phenomenon occurs, in which the data of a memory cell coupled to a word line adjacent to a frequently activated word line is damaged. Such a phenomenon is called row hammering. Due to the row hammering, the data of a memory cell is likely to be damaged before the memory cell is refreshed.

FIG. 1 is a diagram illustrating a portion of a memory cell array included in a semiconductor memory device, for explaining row hammering.

Referring to FIG. 1, a word line WLK corresponds to a frequently activated word line having a large number of activation times, and word lines WLK−1 and WLK+1 correspond to adjacent word lines which are disposed adjacent to the frequently activated word line WLK. Furthermore, a memory cell CELL_K is coupled to the frequently activated word line WLK, a memory cell CELL_K−1 is coupled to the adjacent word line WLK−1, and a memory cell CELL_K+1 is coupled to the adjacent word line WLK+1. The respective memory cells CELL_K, CELL_K−1 and CELL_K+1 include cell transistors TR_K, TR_K−1 and TR_K+1 and cell capacitors CAP_K, CAP_K−1 and CAP_K+1.

In FIG. 1, when the frequently activated word line WLK is activated or deactivated, due to a coupling phenomenon occurring between the frequently activated word line WLK and the adjacent word lines WLK−1 and WLK+1, the voltages of the adjacent word lines WLK−1 and WLK+1 are increased or decreased, and an influence is exerted on the amounts of charges of the cell capacitors CELL_K−1 and CELL_K+1. Therefore, in the case where the activation of the frequently activated word line WLK occurs frequently and thus the frequently activated word line WLK toggles between an activated state and a deactivated state, changes in the amounts of charges stored in the cell capacitors CAP_K−1 and CAP_K+1 included in the memory cells CELL_K−1 and CELL_K+1 may increase, and the data of the memory cells CELL_K−1 and CELL_K+1 may deteriorate.

Moreover, as electromagnetic waves, which are generated while a word line toggles between an activated state and a deactivated state, introduce or discharge electrons into or from the cell capacitors of memory cells coupled to adjacent word lines, data are likely to be damaged.

A method mainly used to cope with the row hammering according to which the data the memory cells coupled to the word lines WLK+1 and WLK−1 deteriorate when the word line WLK is repeatedly activated at least a predetermined number of times, is to additionally refresh the adjacent word lines (for example, WLK+1 and WLK−1) which are influenced by the row hammering, in addition to a general refresh operation (normal refresh operation). Such an additional refresh operation on the adjacent word lines is referred to as a target refresh operation.

SUMMARY

Various embodiments of the present invention are directed to a semiconductor memory device capable of efficiently preventing row hammering in a burst refresh mode.

In an embodiment, a semiconductor memory device may include: a first count circuit suitable for counting a first clock signal which continuously toggles in each burst refresh cycle, and generating a first count code signal, based on a burst refresh command signal; a cycle guide circuit suitable for generating a second clock signal which toggles once in each burst refresh cycle, based on the burst refresh command signal and a precharge signal; a second count circuit suitable for counting the second clock signal and generating a second count code signal; and a control circuit suitable for generating a latch control signal for latching a target address in each burst refresh cycle, based on the first count code signal and the second count code signal.

The control circuit may generate the latch control signal when a first count value corresponding to the first count code signal and a second count value corresponding to the second count code signal are the same.

The first count circuit may count the first clock signal during each burst refresh cycle after being initialized in each burst refresh cycle in response to the burst refresh command signal.

The cycle guide circuit may generate the second clock signal which is activated based on the burst refresh command signal and is deactivated based on the precharge signal.

The control circuit may include: a comparison unit suitable for generating a comparison signal corresponding to a result of comparing a first count value corresponding to the first count code signal and a second count value corresponding to the second count code signal; a limiting unit suitable for generating a limit signal which is activated for a limit period, based on the comparison signal and the burst refresh command signal; and an output unit suitable for outputting the latch control signal which toggles for the limit period, based on the limit signal and the first clock signal.

The semiconductor memory device may further include: a cycle conversion circuit suitable for generating the first clock signal which toggles non-cyclically, based on a third clock signal which toggles cyclically.

In an embodiment, a semiconductor memory device may include: a count circuit suitable for counting a first clock signal which continuously toggles in each burst refresh cycle, and generating a count code signal, based on a burst refresh command signal; a cycle guide circuit suitable for generating a second clock signal which toggles once in each burst refresh cycle, based on the burst refresh command signal and a precharge signal; a randomization circuit suitable for generating a random code signal corresponding to a random value in each burst refresh cycle, based on the second clock signal; and a control circuit suitable for generating a latch control signal for latching a target address in each burst refresh cycle, based on the count code signal and the random code signal.

The control circuit may generate the latch control signal when a count value corresponding to the count code signal and a random value corresponding to the random code signal are the same.

The count circuit may count the first clock signal during each burst refresh cycle after being initialized in each burst refresh cycle in response to the burst refresh command signal.

The cycle guide circuit may generate the second clock signal which is activated based on the burst refresh command signal and is deactivated based on the precharge signal.

The randomization circuit may include: a clock signal generation unit suitable for generating a third clock signal; a random value generation unit suitable for generating a code signal corresponding to the random value at least once in each burst refresh cycle, based on the third clock signal; and a latch unit suitable for latching the code signal as the random code signal in each burst refresh cycle, based on the second clock signal.

The control circuit may include: a comparison unit suitable for generating a comparison signal corresponding to a result of comparing a count value corresponding to the count code signal and the random value corresponding to the random code signal; a limiting unit suitable for generating a limit signal which is activated for a limit period, based on the comparison signal and the burst refresh command signal; and an output unit suitable for outputting the latch control signal which toggles for the limit period, based on the limit signal and the first clock signal.

The semiconductor memory device may further include: a cycle conversion circuit suitable for generating the first clock signal which toggles non-cyclically, based on a fourth clock signal which toggles cyclically.

In an embodiment, a semiconductor memory device may include: a memory region suitable for performing a normal operation based on a normal address signal, and performing a target refresh operation based on a target address signal; a refresh controller suitable for generating a latch control signal which is activated for a limit period different from a previous limit period included in a previous burst refresh cycle, in each burst refresh cycle, based on a burst refresh command signal; and an address latch suitable for latching the normal address signal which is inputted for the different limit period, as the target address signal, in each burst refresh cycle, based on the latch control signal.

The refresh controller may include: a first count circuit suitable for counting a first clock signal which continuously toggles in each burst refresh cycle, and generating a first count code signal, based on the burst refresh command signal; a cycle guide circuit suitable for generating a second clock signal which toggles once in each burst refresh cycle, based on the burst refresh command signal and a precharge signal; a second count circuit suitable for counting the second clock signal and generating a second count code signal; and a control circuit suitable for generating the latch control signal in each burst refresh cycle, based on the first count code signal and the second count code signal.

The control circuit may generate the latch control signal when a first count value corresponding to the first count code signal and a second count value corresponding to the second count code signal are the same.

The first count circuit may count the first clock signal during each burst refresh cycle after being initialized in each burst refresh cycle in response to the burst refresh command signal.

The cycle guide circuit may generate the second clock signal which is activated based on the burst refresh command signal and is deactivated based on the precharge signal.

The control circuit may include: a comparison unit suitable for generating a comparison signal corresponding to a result of comparing a first count value corresponding to the first count code signal and a second count value corresponding to the second count code signal; a limiting unit suitable for generating a limit signal which is activated for the limit period, based on the comparison signal and the burst refresh command signal; and an output unit suitable for outputting the latch control signal which toggles for the limit period, based on the limit signal and the first clock signal.

The refresh controller may further include: a cycle conversion circuit suitable for generating the first clock signal which toggles non-cyclically, based on a third clock signal which toggles cyclically.

The refresh controller may include: a count circuit suitable for counting a first clock signal which continuously toggles in each burst refresh cycle, and generating a count code signal, based on the burst refresh command signal; a cycle guide circuit suitable for generating a second clock signal which toggles once in each burst refresh cycle, based on the burst refresh command signal and a precharge signal; a randomization circuit suitable for generating a random code signal corresponding to a random value in each burst refresh cycle, based on the second clock signal; and a control circuit suitable for generating the latch control signal when a count value corresponding to the count code signal and a random value corresponding to the random code signal are the same in each burst refresh cycle, based on the count code signal and the random code signal.

The control circuit may generate the latch control signal when a count value corresponding to the count code signal and a random value corresponding to the random code signal are the same.

The count circuit may count the first clock signal during each burst refresh cycle after being initialized in each burst refresh cycle in response to the burst refresh command signal.

The cycle guide circuit may generate the second clock signal which is activated based on the burst refresh command signal and is deactivated based on the precharge signal.

The randomization circuit may include: a clock signal generation unit suitable for generating a third clock signal; a random value generation unit suitable for generating a code signal corresponding to the random value at least once in each burst refresh cycle, based on the third clock signal; and a latch unit suitable for latching the code signal as the random code signal in each burst refresh cycle, based on the second clock signal.

The control circuit may include: a comparison unit suitable for generating a comparison signal corresponding to a result of comparing a count value corresponding to the count code signal and the random value corresponding to the random code signal; a limiting unit suitable for generating a limit signal which is activated for the limit period, based on the comparison signal and the burst refresh command signal; and an output unit suitable for outputting the latch control signal which toggles for the limit period, based on the limit signal and the first clock signal.

The refresh controller may include: a cycle conversion circuit suitable for generating the first clock signal which toggles non-cyclically, based on a fourth clock signal which toggles cyclically.

The memory region may perform the target refresh operation in each burst refresh cycle, based on the burst refresh command signal and a previous target address signal which is latched for the previous limit period as the target address signal.

In the embodiments, by efficiently preventing row hammering in a burst refresh mode, operational reliability according to the burst refresh mode may be improved.

DETAILED DESCRIPTION

Figure 1:
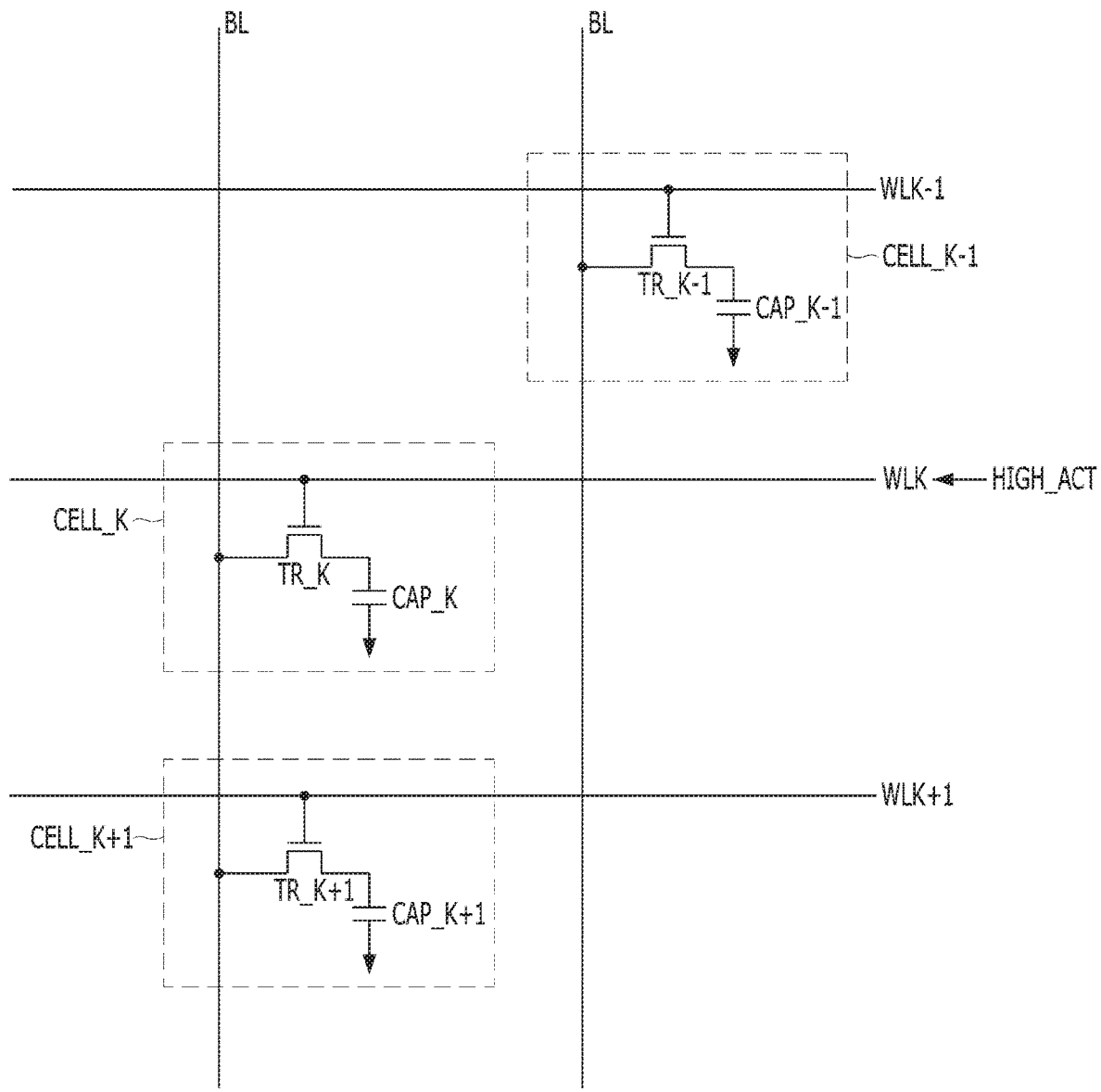
FIG. 1 is a diagram illustrating a portion of a memory cell array, for explaining row hammering.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
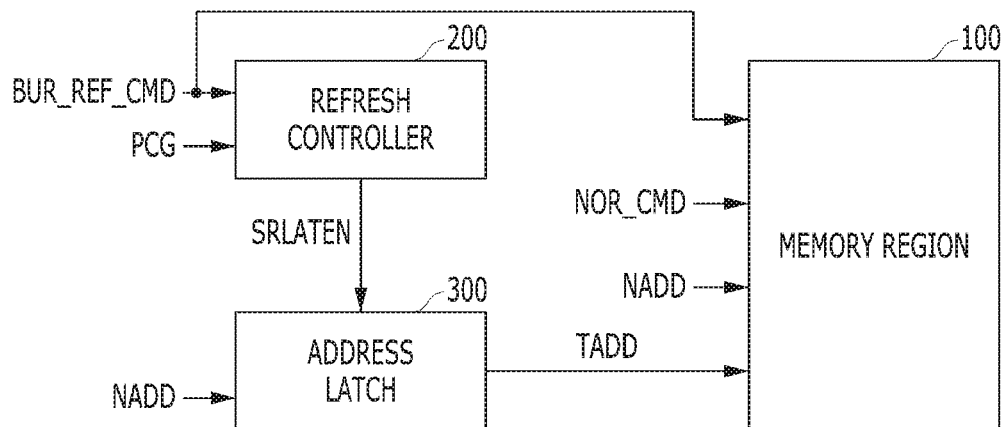
FIG. 2 is a block diagram illustrating a semiconductor memory device, in accordance with a first embodiment of the present invention.

FIG. 2 is a block diagram illustrating a semiconductor memory device in accordance with a first embodiment of the present invention.

Referring to FIG. 2, the semiconductor memory device may include a memory region 100, a refresh controller 200 and an address latch 300.

The memory region 100 may perform a normal operation based on a normal command signal NOR_CMD and a normal address signal NADD, and perform a target refresh operation based on a burst refresh command signal BUR_REF_CMD and a target address signal TADD. While not shown in the drawing, the memory region 100 may include a memory array having a plurality of memory cells arranged in a row direction and a column direction and peripheral circuits for performing the normal operation and the target refresh operation. For example, the peripheral circuits may include a row decoder and a word line driver for controlling the memory array by row.

The burst refresh command signal BUR_REF_CMD may include a plurality of normal refresh command signals which are successively inputted with a minimum time interval therebetween for allowing the target refresh operation to be performed. For example, in an 8-burst refresh operation mode, first to eighth normal refresh command signals may be successively inputted in each burst refresh cycle. In a bust refresh operation mode, a plurality of target refresh operations are concentratedly performed for a certain period of each burst refresh cycle, and thus, it is possible to ensure that another operation (for example, the normal operation) is performed for the remaining period of the burst refresh cycle without being disturbed by the target refresh operations.

The normal operation may include a write operation for writing data in the memory array, a read operation for reading data from the memory array, and so forth. The target refresh operation may include an operation of additionally refreshing adjacent word lines, in addition to a normal refresh operation, to cope with row hammering in which data of memory cells coupled to the adjacent word lines deteriorate as a certain word line is repeatedly accessed and activated at least a predetermined number of times.

The refresh controller 200 may generate, in each burst refresh cycle, a latch control signal SRLATEN for a limit period different from a previous limit period included in a previous burst refresh cycle, based on the burst refresh command signal BUR_REF_CMD and a precharge signal PCG.

The address latch 300 may latch the normal address signal NADD which is inputted for the different limit period in each burst refresh cycle, as the target address signal TADD, based on the latch control signal SRLATEN.

Figure 3:
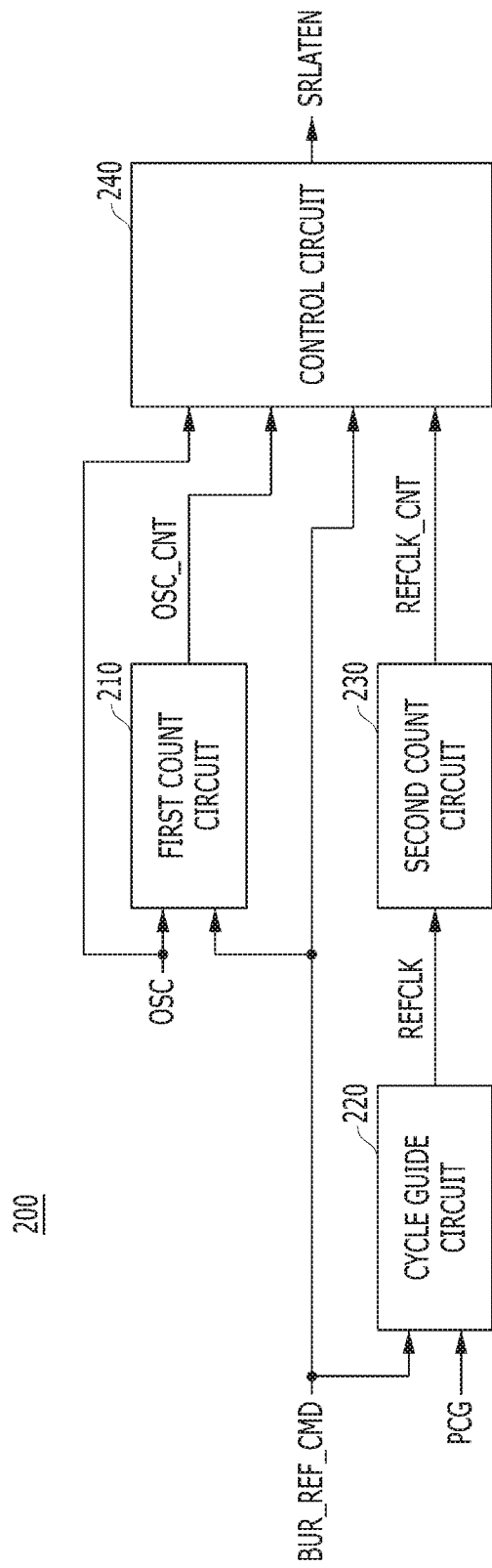
FIG. 3 is a block diagram illustrating a refresh controller shown in FIG. 2, in accordance with an embodiment of the present invention.

FIG. 3 is a block diagram illustrating the refresh controller 200 shown in FIG. 2, in accordance with an embodiment of the present invention.

Referring to FIG. 3, the refresh controller 200 may include a first count circuit 210, a cycle guide circuit 220, a second count circuit 230 and a control circuit 240.

The first count circuit 210 may count a first clock signal OSC which continuously toggles in each burst refresh period, and generate a first count code signal OSC_CNT corresponding to a count value thereof (hereinafter, referred to as a "first count value"), based on the burst refresh command signal BUR_REF_CMD. The first count circuit 210 may count the first clock signal OSC during each burst refresh cycle after being initialized in each burst refresh cycle in response to the burst refresh command signal BUR_REF_CMD.

The cycle guide circuit 220 may generate a second clock signal REFCLK which toggles once in each burst refresh cycle, based on the burst refresh command signal BUR_REF_CMD and the precharge signal PCG. The cycle guide circuit 220 may generate the second clock signal REFCLK which is activated based on the burst refresh command signal BUR_REF_CMD and is deactivated based on the precharge signal PCG. For example, the cycle guide circuit 220 may include an SR latch.

The second count circuit 230 may count the second clock signal REFCLK, and generate a second count code signal REFCLK_CNT corresponding to a count value thereof (hereinafter, referred to as a "second count value").

The control circuit 240 may generate the latch control signal SRLATEN in each burst refresh cycle, based on the first count code signal OSC_CNT and the second count code signal REFCLK_CNT. The control circuit 240 may generate the latch control signal SRLATEN when the first count value and the second count value are the same in each burst refresh cycle.

Figure 4:
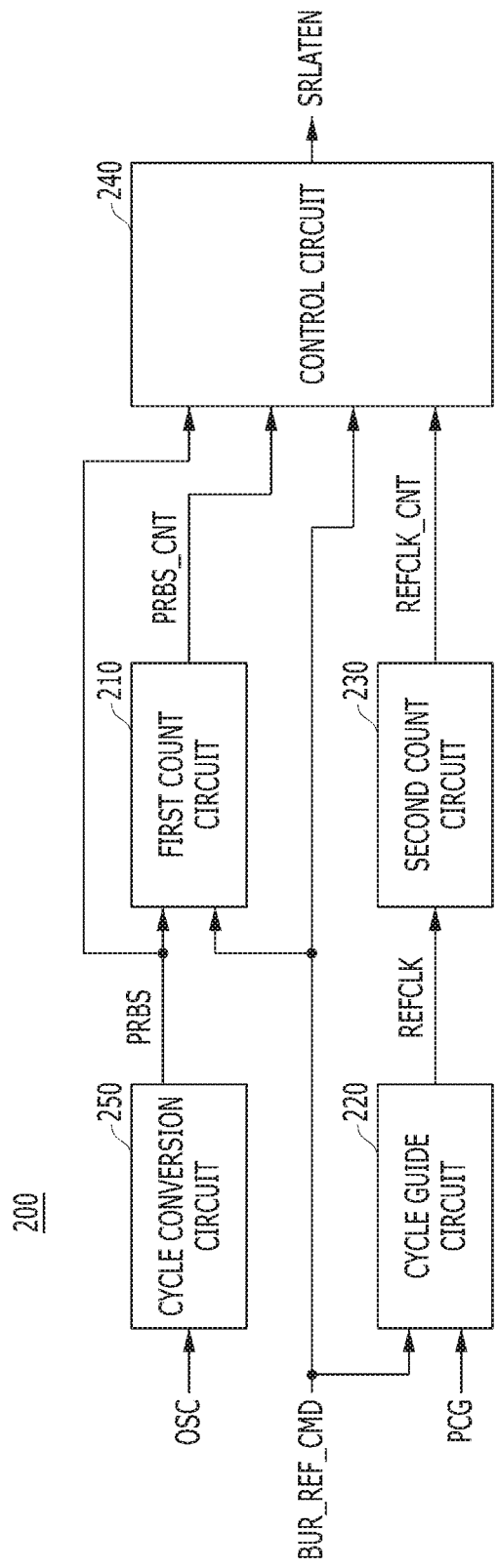
FIG. 4 is a block diagram illustrating the refresh controller shown in FIG. 2, in accordance with another embodiment of the present invention.

FIG. 4 is a block diagram illustrating the refresh controller 200 shown in FIG. 2, in accordance with another embodiment of the present invention. In FIGS. 3 and 4, like reference numerals are used to refer to the same elements.

Referring to FIG. 4, the refresh controller 200 may include a first count circuit 210, a cycle guide circuit 220, a second count circuit 230, a control circuit 240 and a cycle conversion circuit 250.

Since the first count circuit 210, the cycle guide circuit 220, the second count circuit 230 and the control circuit 240 shown in FIG. 4 have substantially the same configuration as those shown in FIG. 3, descriptions therefor will be omitted herein. However, the first count circuit 210 may generate a first count code signal PRBS_CNT based on a third clock signal PRBS which will be described below, and the control circuit 240 may generate a latch control signal SRLATEN using the third clock signal PRBS and the first count code signal PRBS_CNT instead of the first clock signal OSC and the first count code signal OSC_CNT shown in FIG. 3.

The control circuit 240 may generate the latch control signal SRLATEN when a first count value and a second count value are the same, based on the first count code signal PRBS_CNT and a second count code signal REFCLK_CNT.

The cycle conversion circuit 250 may generate the third clock signal PRBS which toggles non-cyclically, based on a first clock signal OSC which toggles cyclically. For example, the cycle conversion circuit 250 may include a pseudo-random binary sequence (PRBS) circuit.

Figure 5:
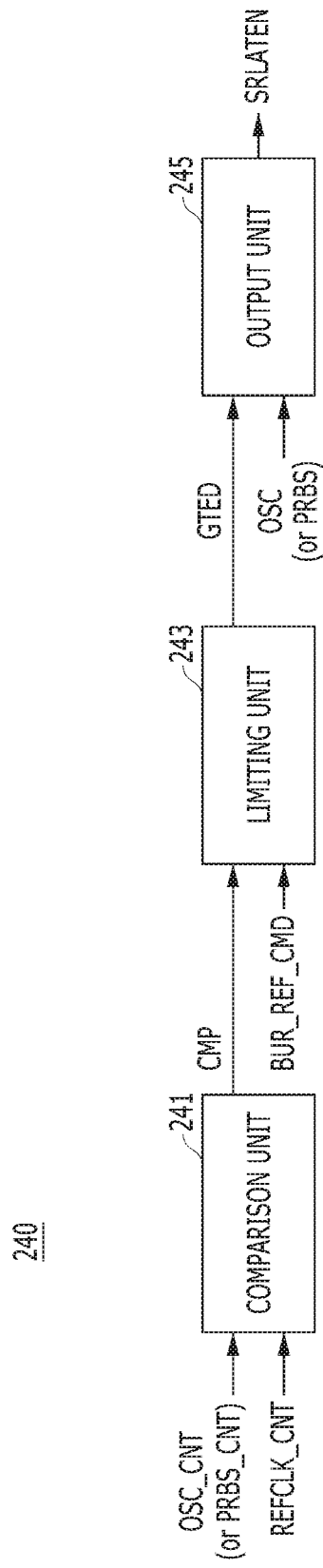
FIG. 5 is a block diagram illustrating a control circuit shown in FIGS. 3 and 4.

FIG. 5 is a block diagram illustrating the control circuit 240 shown in FIGS. 3 and 4. Hereinbelow, for the sake of convenience in explanation, the control circuit 240 shown in FIG. 3 will be described representatively.

Referring to FIG. 5, the control circuit 240 may include a comparison unit 241, a limiting unit 243 and an output unit 245.

The comparison unit 241 may generate a comparison signal CMP corresponding to a result of comparing the first count value and the second count value, based on the first count code signal OSC_CNT and the second count code signal REFCLK_CNT.

The limiting unit 243 may generate a limit signal GTED which is activated for a limit period, based on the comparison signal CMP and the burst refresh command signal BUR_REF_CMD. For example, the limiting unit 243 may generate the limit signal GTED which is activated based on the burst refresh command signal BUR_REF_CMD and is deactivated based on the comparison signal CMP.

The output unit 245 may generate the latch control signal SRLATEN which toggles for the limit period, based on the limit signal GTED and the first clock signal OSC. The output unit 245 may generate the latch control signal SRLATEN by gating the first clock signal OSC according to the limit signal GTED. The output unit 245 may output the first clock signal OSC as the latch control signal SRLATEN when the limit signal GTED is activated for the limit period.

Hereinafter, an operation of the semiconductor memory device in accordance with the first embodiment, having the above-described configuration, will be described with reference to FIGS. 6 and 7.

Figure 6:
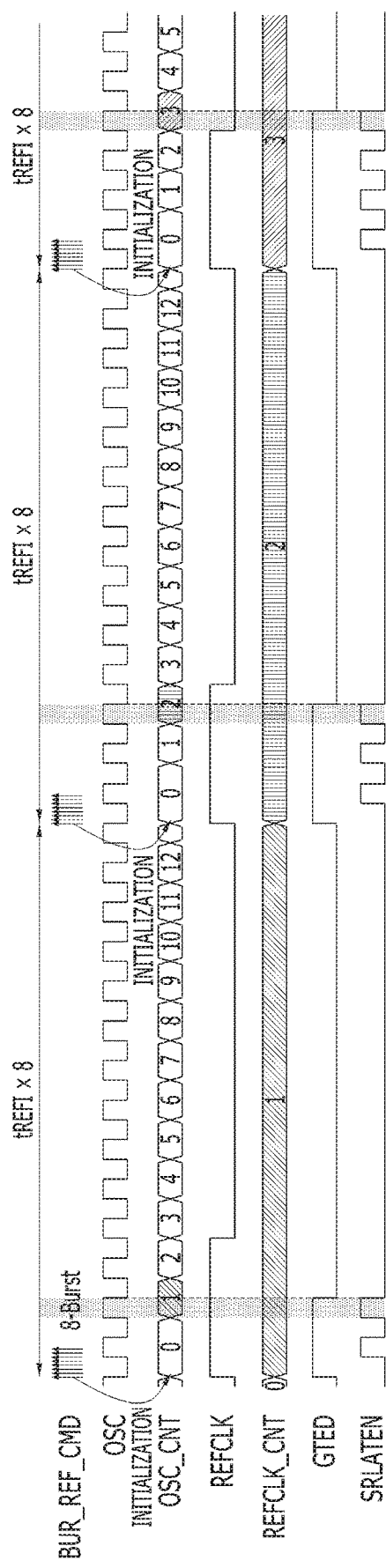
FIG. 6 is a timing diagram explaining an operation of the semiconductor memory device including the refresh controller shown in FIG. 3.

FIG. 6 is a timing diagram explaining an operation of the semiconductor memory device including the refresh controller 200 shown in FIG. 3.

Referring to FIG. 6, when the burst refresh command signal BUR_REF_CMD which includes the first to eighth normal refresh command signals is inputted in the 8-burst refresh operation mode, a burst refresh cycle tREFI*8 may include a period corresponding to 8 times a normal refresh cycle tREFI allocated to each of the first to eighth normal refresh command signals.

The refresh controller 200 may generate, in each burst refresh cycle tREFI*8, the latch control signal SRLATEN for a limit period different from a previous limit period included in a previous burst refresh cycle. For example, the refresh controller 200 may generate the latch control signal SRLATEN when the first count value corresponding to the first count code signal OSC_CNT and the second count value corresponding to the second count code signal REFCLK_CNT are the same, in each burst refresh cycle tREFI*8. That is, in a first burst refresh cycle tREFI*8, the refresh controller 200 may output the first clock signal OSC as the latch control signal SRLATEN when the limit signal GTED is activated for a first limit period from a point of time when the burst refresh command signal BUR_REF_CMD is inputted to a point of time when both the first count value and the second count value become "1." Further, in an n^th burst refresh cycle tREFI*8, the refresh controller 200 may output the first clock signal OSC as the latch control signal SRLATEN when the limit signal GTED is activated for an n^th limit period from a point of time when the burst refresh command signal BUR_REF_CMD is inputted to a point of time when both the first count value and the second count value become "n."

The address latch 300 may latch the normal address signal NADD which is inputted for a different limit period in each burst refresh cycle tREFI*8, as the target address signal TADD, based on the latch control signal SRLATEN. For example, in the first burst refresh cycle tREFI*8, the address latch 300 may latch the normal address signal NADD which is inputted when the latch control signal SRLATEN toggles a second time (that is, toggles last) during the first limit period, as the target address signal TADD. Further, in the n^th burst refresh cycle tREFI*8, the address latch 300 may latch the normal address signal NADD which is inputted when the latch control signal SRLATEN toggles an (n+1)^th time (that is, toggles last) during the n^th limit period, as the target address signal TADD.

For reference, in the case where the latch control signal SRLATEN toggles a plurality of times for each burst refresh cycle tREFI*8, the address latch 300 may latch the normal address signal NADD which is inputted each time the latch control signal SRLATEN toggles. As a result, the address latch 300 may latch the normal address signal NADD which is inputted when the latch control signal SRLATEN toggles last, as the final target address signal TADD.

Meanwhile, the address latch 300 may latch the normal address signal NADD which is inputted for a period in which the latch control signal SRLATEN toggles last, in a limit period defined differently in each burst refresh cycle tREFI*8, as the target address signal TADD. This is to sample any one normal address signal NADD among a plurality of normal address signals NADD which are sequentially inputted for the burst refresh cycle tREFI*8. In other words, this is to sample any one normal address signal NADD which is inputted for a different period in each burst refresh cycle tREFI*8. Here, sampling may mean to stochastically select a normal address signal NADD which is inputted most, among the plurality of normal address signals NADD. This is advantageous in terms of power and area in comparison with a method of counting the plurality of normal address signals NADD by each normal address signal, and is also advantageous in that it is possible to sample and latch the normal address signal NADD which is inputted at a different sampling point of time in each burst refresh cycle tREFI*8, as the target address signal TADD.

The memory region 100 may perform the target refresh operation based on the burst refresh command signal BUR_REF_CMD and the target address signal TADD. For example, when the burst refresh command signal BUR_REF_CMD is inputted, the memory region 100 may perform the target refresh operation based on a previous target address signal TADD which is latched for a previous limit period, in each burst refresh cycle.

Figure 7:
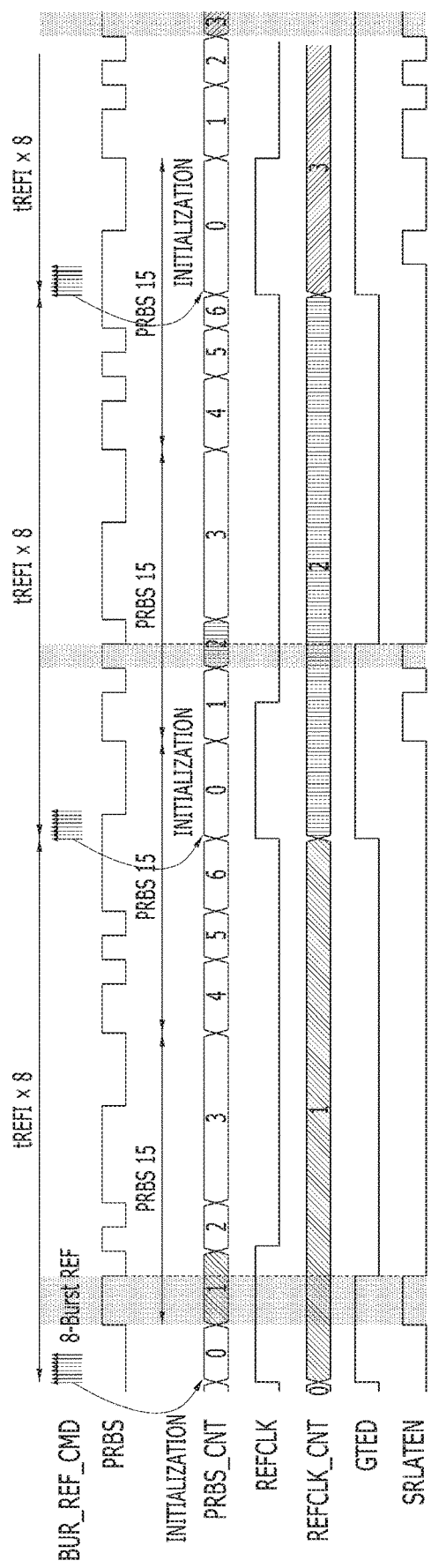
FIG. 7 is a timing diagram explaining an operation of the semiconductor memory device including the refresh controller shown in FIG. 4.

FIG. 7 is a timing diagram explaining an operation of the semiconductor memory device including the refresh controller 200 shown in FIG. 4.

Since FIG. 7 is substantially the same as FIG. 6, descriptions thereof will be omitted herein. However, in FIG. 7, when compared to FIG. 6, the third clock signal PRBS which toggles non-cyclically may be used instead of the first clock signal OSC which toggles cyclically. For example, the third clock signal PRBS may toggle non-cyclically in each predetermined cycle PRBS 15.

Figure 8:
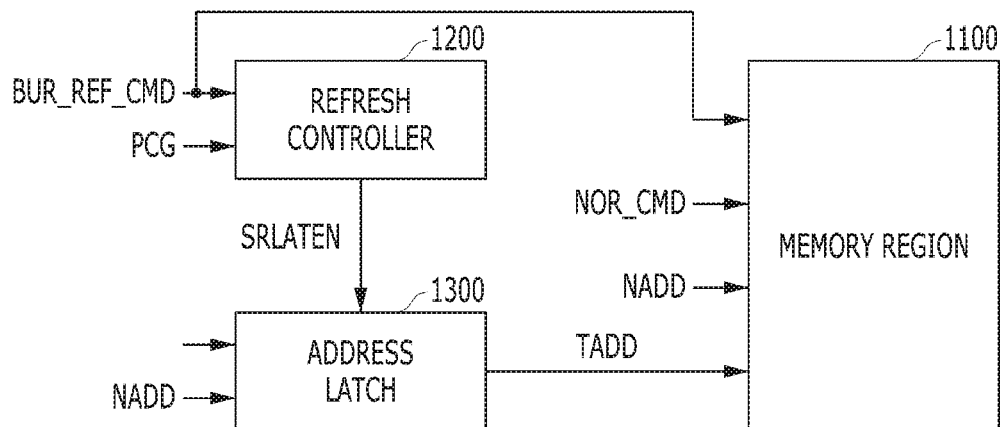
FIG. 8 is a block diagram illustrating a semiconductor memory device, in accordance with a second embodiment of the present invention.

FIG. 8 is a block diagram illustrating a semiconductor memory device in accordance with a second embodiment of the present invention.

Referring to FIG. 8, the semiconductor memory device may include a memory region 1100, a refresh controller 1200 and an address latch 1300.

Since the memory region 1100 and the address latch 1300 may have substantially the same configurations as the memory region 100 and the address latch 300 illustrated in the first embodiment, descriptions for the memory region 1100 and the address latch 1300 will be omitted herein. Hereafter, the refresh controller 1200 will be described in detail.

Figure 9:
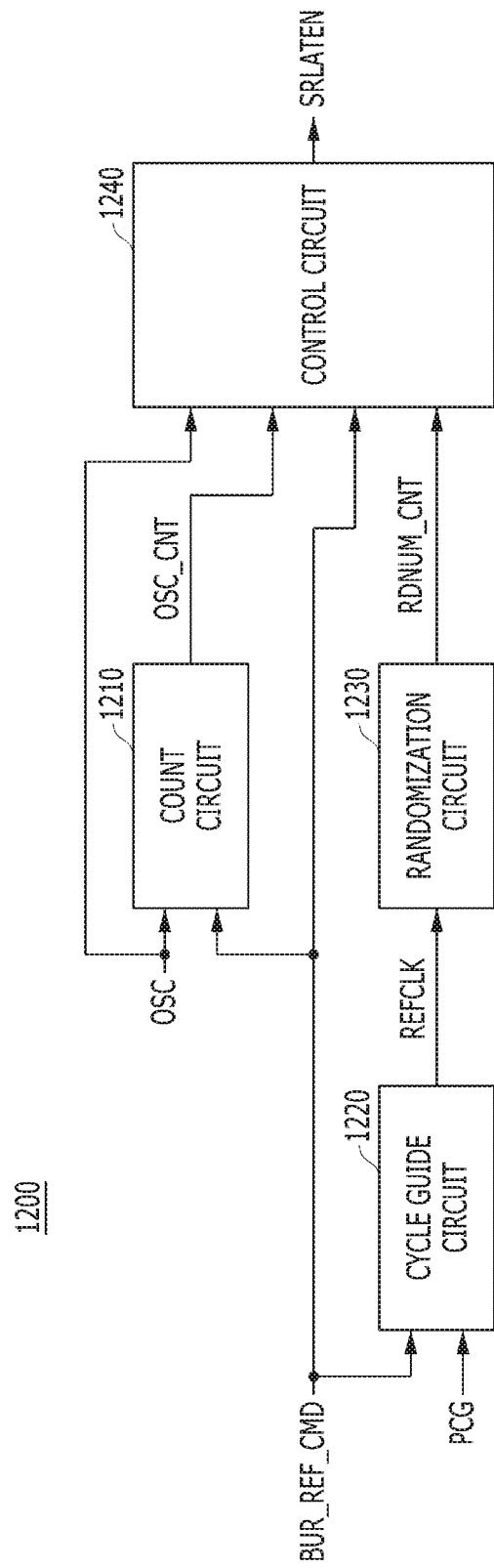
FIG. 9 is a block diagram illustrating a refresh controller shown in FIG. 8.

FIG. 9 is a block diagram illustrating the refresh controller 1200 shown in FIG. 8.

Referring to FIG. 9, the refresh controller 1200 may include a count circuit 1210, a cycle guide circuit 1220, a randomization circuit 1230 and a control circuit 1240.

Since the count circuit 1210, the cycle guide circuit 1220 and the control circuit 1240 may have substantially the same configuration as the count circuit 210, the cycle guide circuit 220 and the control circuit 240 included in the first embodiment (see FIG. 3), descriptions therefor will be omitted herein.

The randomization circuit 1230 may generate a random code signal RDNUM_CNT corresponding to a random value in each burst refresh cycle, based on a second clock signal REFCLK.

Figure 10:
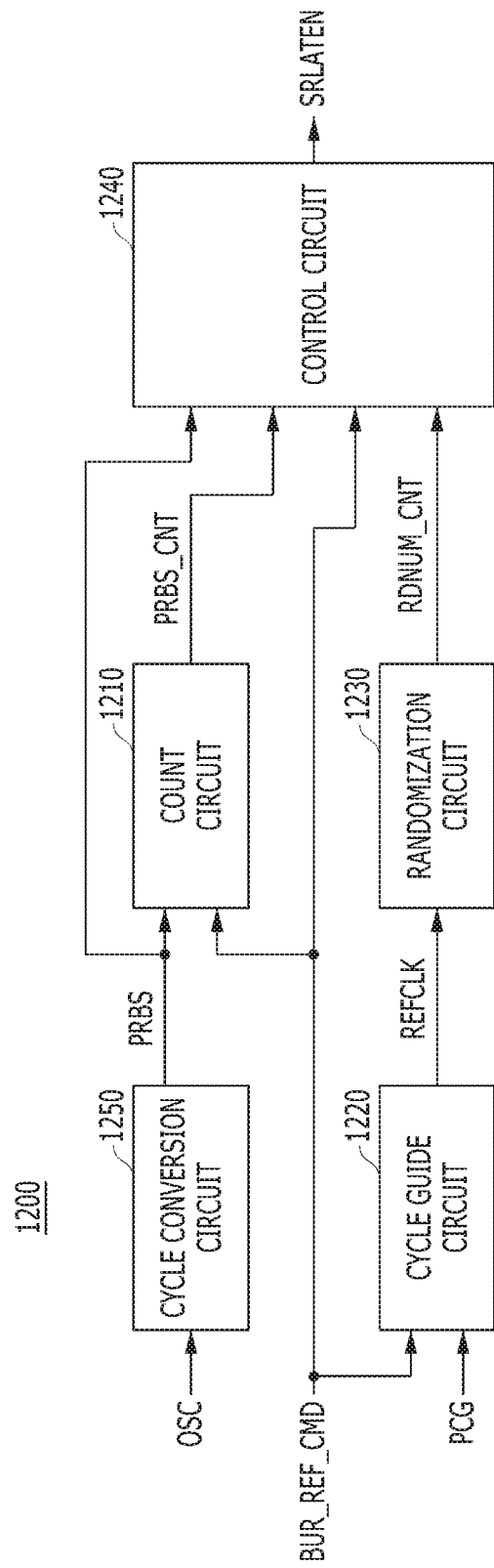
FIG. 10 is a block diagram illustrating the refresh controller shown in FIG. 8.

FIG. 10 is a block diagram illustrating the refresh controller 1200 shown in FIG. 8.

Referring to FIG. 10, the refresh controller 1200 may further include a cycle conversion circuit 1250 when compared to FIG. 9. Since the cycle conversion circuit 1250 may have substantially the same configuration as the cycle conversion circuit 250 included in the first embodiment (see FIG. 4), descriptions therefor will be omitted herein.

Figure 11:
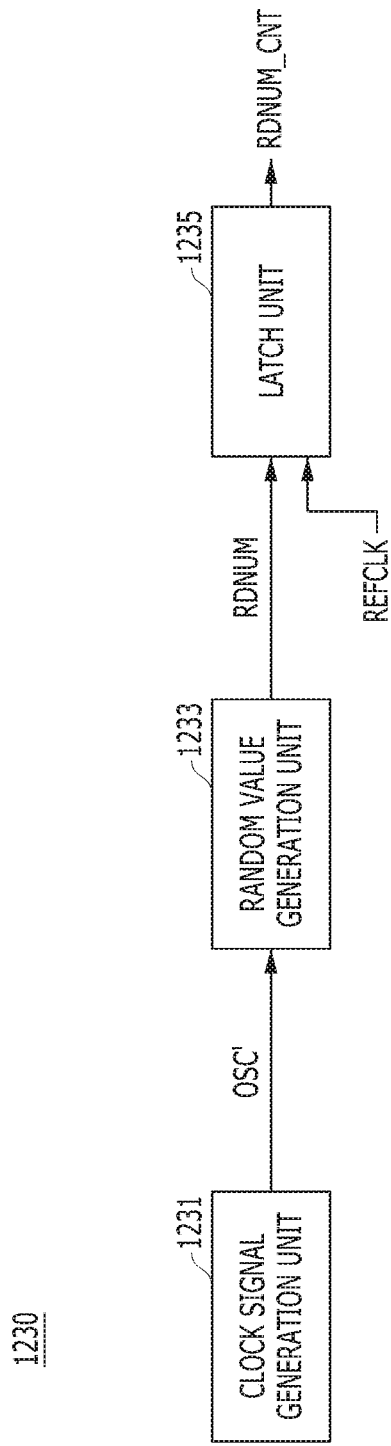
FIG. 11 is a block diagram illustrating a randomization circuit shown in FIGS. 9 and 10.

FIG. 11 is a block diagram illustrating the randomization circuit 1230 shown in FIGS. 9 and 10.

Referring to FIG. 11, the randomization circuit 1230 may include a clock signal generation unit 1231, a random value generation unit 1233, and a latch unit 1235.

The clock signal generation unit 1231 may generate a fourth clock signal OSC'.

The randomization value generation unit 1233 may generate a code signal RDNUM corresponding to the random value at least once in each burst refresh cycle, based on the fourth clock signal OSC'.

The latch unit 1235 may latch the code signal RDNUM as the random code signal RDNUM_CNT in each burst refresh cycle, based on the second clock signal REFCLK.

Figure 12:
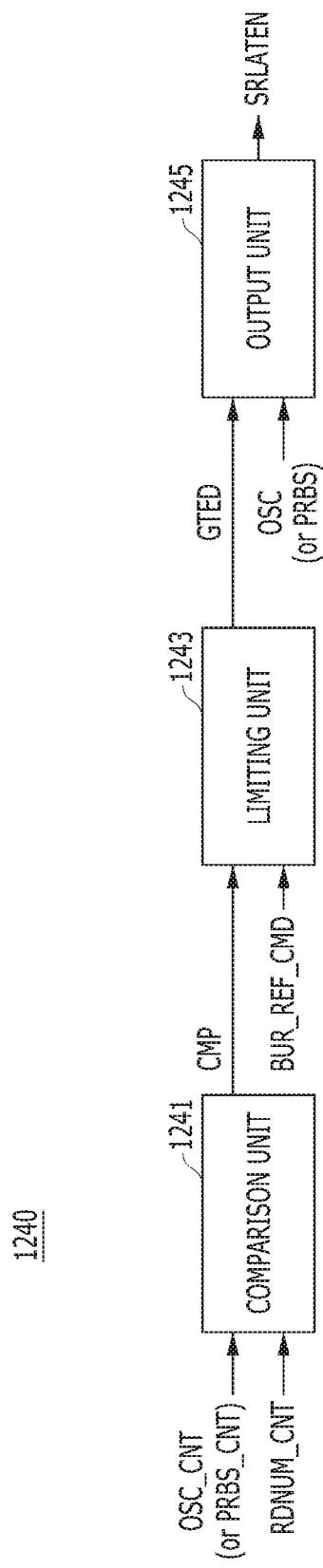
FIG. 12 is a block diagram illustrating a control circuit shown in FIGS. 9 and 10.

FIG. 12 is a block diagram illustrating the control circuit 1240 shown in FIGS. 9 and 10.

Referring to FIG. 12, the control circuit 1240 may include a comparison unit 1241, a limiting unit 1243 and an output unit 1245.

Since the comparison unit 1241, the limiting unit 1243 and the output unit 1245 may have substantially the same configuration as those of the first embodiment, detailed descriptions therefor will be omitted herein. However, the comparison unit 1241 may compare the random code signal RDNUM_CNT and a count code signal OSC_CNT or PRBS_CNT.

Hereinafter, the operation of the semiconductor memory device in accordance with the second embodiment, having the above-described configuration, will be described with reference to FIG. 13.

Figure 13:
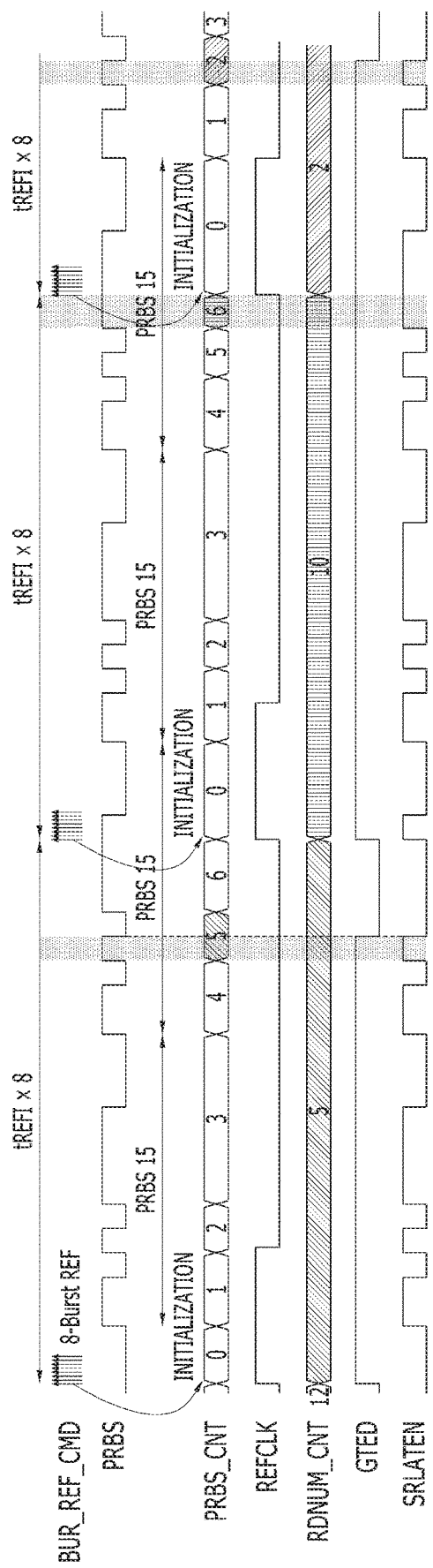
FIG. 13 is a timing diagram explaining an operation of the semiconductor memory device including the refresh controller shown in FIG. 10.

FIG. 13 is a timing diagram explaining an operation of the semiconductor memory device including the refresh controller 1200 shown in FIG. 10.

Referring to FIG. 13, when a burst refresh command signal BUR_REF_CMD which includes first to eighth normal refresh command signals is inputted in an 8-burst refresh operation mode, a burst refresh cycle tREFI*8 may include a period corresponding to 8 times a refresh cycle tREFI allocated to each of the first to eighth normal refresh command signals.

The refresh controller 1200 may generate, in each burst refresh cycle tREFI*8, a latch control signal SRLATEN for a limit period different from a previous limit period included in a previous burst refresh cycle. For example, the refresh controller 1200 may generate the latch control signal SRLATEN when a count value corresponding to the count code signal PRBS_CNT and a random value corresponding to the random code signal RDNUM_CNT are the same, in each burst refresh cycle tREFI*8. If the random code signal RDNUM_CNT corresponding to the random value of "5" is generated in a first burst refresh cycle tREFI*8, the control circuit 1240 may output a third clock signal PRBS as the latch control signal SRLATEN when a limit signal GTED is activated for a first limit period from a point of time when the burst refresh command signal BUR_REF_CMD is inputted to a point of time when the count value corresponding to the count code signal PRBS_CNT becomes the random value of "5." If the random code signal RDNUM_CNT corresponding to the random value of "10" is generated in a second burst refresh cycle tREFI*8, the control circuit 1240 may output the third clock signal PRBS as the latch control signal SRLATEN when a limit signal GTED is activated for a second limit period including the entire period of the second burst refresh cycle tREFI*8.

The address latch 1300 may latch a normal address signal NADD which is inputted for a different limit period in each burst refresh cycle tREFI*8, as a target address signal TADD, based on the latch control signal SRLATEN. For example, in the first burst refresh cycle tREFI*8, the address latch 1300 may latch the normal address signal NADD which is inputted when the latch control signal SRLATEN toggles last during the first limit period, as the target address signal TADD.

The memory region 1100 may perform a target refresh operation based on the burst refresh command signal BUR_REF_CMD and the target address signal TADD. For example, when the burst refresh command signal BUR_REF_CMD is inputted, the memory region 1100 may perform the target refresh operation based on a previous target address signal TADD which is latched for a previous limit period, in each burst refresh cycle.

As is apparent from the embodiments of the present disclosure, advantages are provided in that a target address signal may be latched (that is, sampled) at a different point of time (that is, a different sampling point of time) in each burst refresh cycle.

Although various embodiments have been described for illustrative purposes, it will be apparent to those skilled in the art that various changes and modifications may be made without departing from the spirit and scope of the invention as defined in the following claims.

What is claimed is:

1. A semiconductor memory device comprising:
    a count circuit suitable for counting a first clock signal which continuously toggles in each burst refresh cycle, and generating a count code signal, based on a burst refresh command signal;
    a cycle guide circuit suitable for generating a second clock signal which toggles once in each burst refresh cycle, based on the burst refresh command signal and a precharge signal;
    a randomization circuit suitable for generating a random code signal corresponding to a random value in each burst refresh cycle, based on the second clock signal; and
    a control circuit suitable for generating a latch control signal for latching a target address in each burst refresh cycle, based on the count code signal and the random code signal,
    wherein the randomization circuit comprises:
        a clock signal generation unit suitable for generating a third clock signal;
        a random value generation unit suitable for generating a code signal corresponding to the random value at least once in each burst refresh cycle, based on the third clock signal; and
        a latch unit suitable for latching the code signal as the random code signal in each burst refresh cycle, based on the second clock signal.

2. The semiconductor memory device according to claim 1, the control circuit generates the latch control signal when a count value corresponding to the count code signal and a random value corresponding to the random code signal are the same.

3. The semiconductor memory device according to claim 1, wherein the count circuit counts the first clock signal during each burst refresh cycle after being initialized in each burst refresh cycle in response to the burst refresh command signal.

4. The semiconductor memory device according to claim 1, wherein the cycle guide circuit generates the second clock signal which is activated based on the burst refresh command signal and is deactivated based on the precharge signal.

5. The semiconductor memory device according to claim 1, wherein the control circuit comprises:
    a comparison unit suitable for generating a comparison signal corresponding to a result of comparing a count value corresponding to the count code signal and the random value corresponding to the random code signal;
    a limiting unit suitable for generating a limit signal which is activated for a limit period, based on the comparison signal and the burst refresh command signal; and
    an output unit suitable for outputting the latch control signal which toggles for the limit period, based on the limit signal and the first clock signal.

6. The semiconductor memory device according to claim 1, further comprising:
    a cycle conversion circuit suitable for generating the first clock signal which toggles non-cyclically, based on a fourth clock signal which toggles cyclically.

7. A semiconductor memory device comprising:
    a count circuit suitable for counting a first clock signal which continuously toggles in each burst refresh cycle, and generating a count code signal, based on a burst refresh command signal;
    a cycle guide circuit suitable for generating a second clock signal which toggles once in each burst refresh cycle, based on the burst refresh command signal and a precharge signal;
    a randomization circuit suitable for generating a random code signal corresponding to a random value in each burst refresh cycle, based on the second clock signal; and
    a control circuit suitable for generating a latch control signal for latching a target address in each burst refresh cycle, based on the count code signal and the random code signal,
    wherein the control circuit comprises:
        a comparison unit suitable for generating a comparison signal corresponding to a result of comparing a count value corresponding to the count code signal and the random value corresponding to the random code signal;

a limiting unit suitable for generating a limit signal which is activated for a limit period, based on the comparison signal and the burst refresh command signal; and an output unit suitable for outputting the latch control signal which toggles for the limit period, based on the limit signal and the first clock signal.

8. The semiconductor memory device according to claim 7, the control circuit generates the latch control signal when a count value corresponding to the count code signal and a random value corresponding to the random code signal are the same.

9. The semiconductor memory device according to claim 7, wherein the count circuit counts the first clock signal during each burst refresh cycle after being initialized in each burst refresh cycle in response to the burst refresh command signal.

10. The semiconductor memory device according to claim 7, wherein the cycle guide circuit generates the second clock signal which is activated based on the burst refresh command signal and is deactivated based on the precharge signal.

11. The semiconductor memory device according to claim 7, further comprising:

a cycle conversion circuit suitable for generating the first clock signal which toggles non-cyclically, based on a fourth clock signal which toggles cyclically.

* * * * *